United States Patent
Chia et al.

(10) Patent No.: US 10,912,216 B1
(45) Date of Patent: Feb. 2, 2021

(54) BIDIRECTIONAL INSTALLATION MODULE FOR MODULAR ELECTRONIC SYSTEM

(71) Applicant: CISCO TECHNOLOGY, INC., San Jose, CA (US)

(72) Inventors: Vic Hong Chia, Sunnyvale, CA (US); Edward John Kliewer, Sunnyvale, CA (US); Amrik S. Bains, Livermore, CA (US); Khanh Tieu Ly, San Jose, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 27 days.

(21) Appl. No.: 16/246,243

(22) Filed: Jan. 11, 2019

Related U.S. Application Data

(60) Provisional application No. 62/737,073, filed on Sep. 26, 2018.

(51) Int. Cl.
*H05K 5/02* (2006.01)
*H05K 7/20* (2006.01)
*H05K 7/14* (2006.01)

(52) U.S. Cl.
CPC ......... *H05K 5/0256* (2013.01); *H05K 7/1407* (2013.01); *H05K 7/1487* (2013.01); *H05K 7/1489* (2013.01); *H05K 7/20172* (2013.01); *H05K 7/20581* (2013.01)

(58) Field of Classification Search
CPC .......... H05K 7/20145; H05K 7/20554; H05K 7/20572; H05K 7/20736; H05K 7/1409; H05K 7/1407; H05K 7/1487; H05K 7/1489; H05K 7/20172; H05K 5/0295; H05K 5/0256; H01R 13/629

USPC ............ 361/679.5, 692, 693, 695; 454/184; 439/152, 153, 157

See application file for complete search history.

(56) References Cited

U.S. PATENT DOCUMENTS

| | | | | |
|---|---|---|---|---|
| 4,855,535 A | * | 8/1989 | Pereyda | H05K 7/1409 174/559 |
| 6,388,880 B1 | * | 5/2002 | El-Ghobashy | H05K 7/20172 165/104.33 |
| 6,549,406 B1 | * | 4/2003 | Olesiewicz | H05K 7/20581 165/80.3 |
| 6,741,466 B1 | * | 5/2004 | Lebo | H05K 7/1412 29/830 |
| 6,767,186 B2 | | 7/2004 | Olesiewicz | |
| 7,054,155 B1 | * | 5/2006 | Mease | H05K 7/20581 165/104.34 |
| 7,414,852 B1 | * | 8/2008 | Otte | H05K 7/1424 312/223.1 |

(Continued)

*Primary Examiner* — Zachary Pape
*Assistant Examiner* — Amir A Jalali
(74) *Attorney, Agent, or Firm* — Cindy Kaplan

(57) ABSTRACT

In one embodiment, an apparatus includes a module for installation in a modular electronic system. The module generally comprises a subassembly for insertion into a front opening in a chassis of the modular electronic system or removal from the front opening in the chassis and an adapter comprising a first interface for mating with the subassembly and a second interface for mating with the modular electronic system. The adapter remains in the chassis during removal of the subassembly from the front opening in the chassis and the module is configured for insertion into a rear opening in the chassis or removal from the rear opening in the chassis with the subassembly coupled to the adapter.

20 Claims, 10 Drawing Sheets

(56) References Cited

U.S. PATENT DOCUMENTS

| | | | |
|---|---|---|---|
| 7,639,486 B2 | 12/2009 | Champion | |
| 7,826,222 B2 | 11/2010 | Aybay | |
| 7,983,039 B1* | 7/2011 | Nguyen | H05K 7/20727 |
| | | | 361/694 |
| 9,076,498 B1* | 7/2015 | Kuo | G11B 33/124 |
| 9,204,576 B2 | 12/2015 | Goulden | |
| 10,178,806 B1* | 1/2019 | Fricker | H05K 7/20581 |
| 10,292,304 B2* | 5/2019 | Sieber | H01Q 1/42 |
| 2004/0264145 A1* | 12/2004 | Miller | H05K 7/1489 |
| | | | 361/725 |
| 2011/0116233 A1* | 5/2011 | Beaudoin | H05K 7/20581 |
| | | | 361/695 |
| 2011/0286176 A1* | 11/2011 | Malmberg | H05K 7/20581 |
| | | | 361/679.48 |
| 2012/0111534 A1* | 5/2012 | Chen | H05K 7/20736 |
| | | | 165/80.3 |
| 2012/0117289 A1* | 5/2012 | Morgan | G06F 13/385 |
| | | | 710/301 |
| 2015/0181760 A1* | 6/2015 | Stephens | H05K 3/368 |
| | | | 361/695 |
| 2017/0273210 A1* | 9/2017 | Zhou | H05K 7/1487 |
| 2018/0116064 A1* | 4/2018 | Chiang | H05K 7/026 |
| 2019/0182987 A1* | 6/2019 | Chen | H05K 7/20736 |
| 2020/0015386 A1* | 1/2020 | Gupta | H05K 7/20172 |

* cited by examiner

BIDIRECTIONAL INSTALLATION MODULE FOR MODULAR ELECTRONIC SYSTEM

STATEMENT OF RELATED APPLICATION

The present application claims priority from U.S. Provisional Application No. 62/737,073, entitled DUAL SERVICEABLE FAN TRAY IN MODULAR ELECTRONIC SYSTEM, filed on Sep. 26, 2018. The contents of this provisional application are incorporated herein by reference in its entirety.

TECHNICAL FIELD

The present disclosure relates generally to network communications devices, and more particularly, to installation and removal of modules in a modular electronic system.

BACKGROUND

Modular electronic systems are designed to provide flexibility to configure systems as per user needs. The systems have multiple slots to accommodate a variety of modules. Conventional field replaceable units (FRUs) such as fan trays are designed for use in a single serviceable direction.

BRIEF DESCRIPTION OF THE DRAWINGS

Corresponding reference characters indicate corresponding parts throughout the several views of the drawings.

DESCRIPTION OF EXAMPLE EMBODIMENTS

Overview

Figure 1:
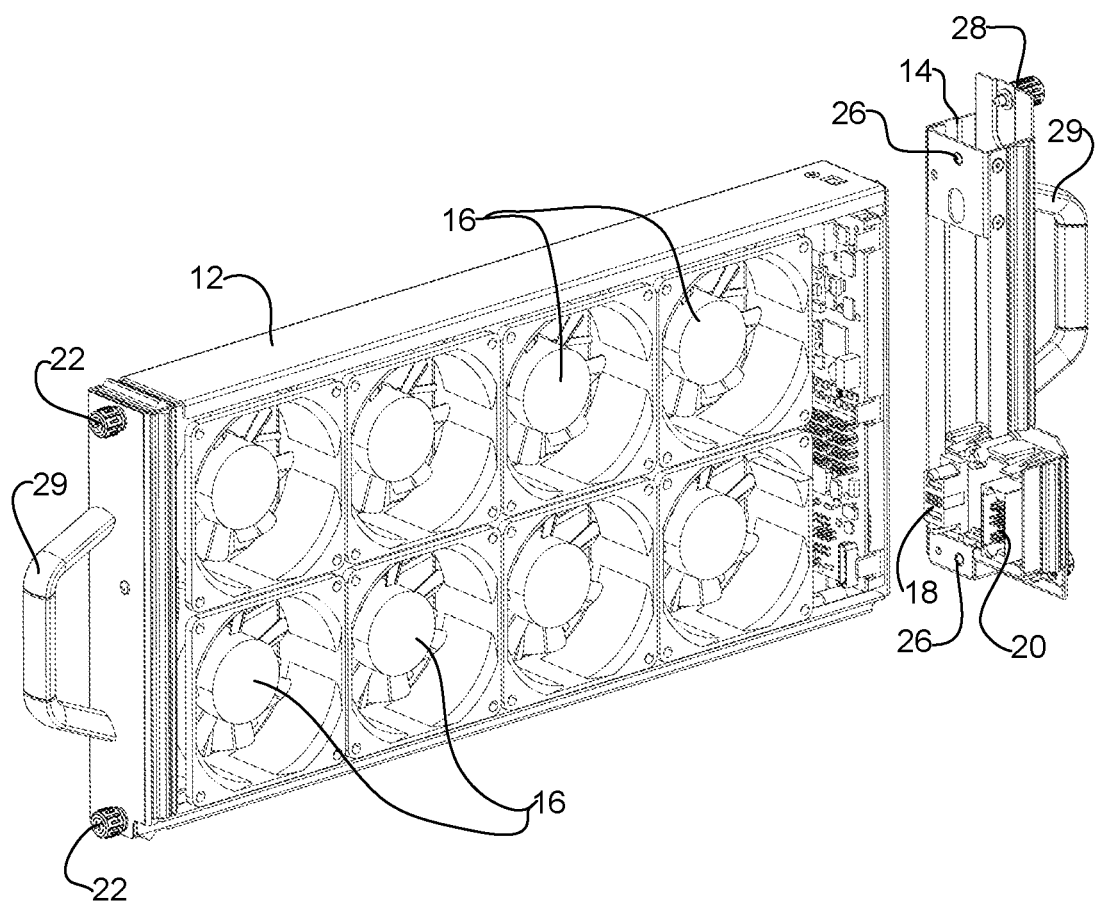
FIG. 1 is a perspective of a bidirectional installation fan tray with an adapter separated from a fan tray subassembly, in accordance with one embodiment.

In one embodiment, an apparatus comprises a module for installation in a modular electronic system. The module generally comprises a subassembly for insertion into a front opening in a chassis of the modular electronic system or removal from the front opening in the chassis and an adapter comprising a first interface for mating with the subassembly and a second interface for mating with the modular electronic system. The adapter remains in the chassis during removal of the subassembly from the front opening in the chassis and the module is configured for insertion into a rear opening in the chassis or removal from the rear opening in the chassis with the subassembly coupled to the adapter.

In one or more embodiments, the module comprises a fan tray and the subassembly comprises a plurality of fans.

In one or more embodiments, the subassembly is coupled to the adapter with thumb screws. The thumb screws may extend from a front face of the subassembly to a rear face of the subassembly for attachment to the adapter. The adapter may comprise at least one thumb screw for attachment of the adapter to the chassis.

In one or more embodiments, the first and second interfaces of the adapter comprise a floating interface for alignment with the subassembly and the modular electronic system. The second interface comprises a power and data interface for mating with a system backplane of the modular electronic system.

In one or more embodiments, a front face of the subassembly and a rear face of the adapter each comprises a handle for insertion and removal of the subassembly or the module from the chassis.

In another embodiment, a modular electronic system generally comprises a chassis comprising openings on opposite sides thereof and a fan tray comprising a fan tray subassembly comprising a plurality of fans and an adapter for coupling the fan tray subassembly to the modular electronic system. The fan tray subassembly is configured for insertion into and removal from one of the openings in the chassis for mating with the adapter in the chassis and the fan tray comprising the coupled fan tray subassembly and the adapter is configured for insertion into and removal from the other opening in the chassis.

In yet another embodiment, a method generally comprises inserting a module into a first opening in a chassis, the module comprising a subassembly and an adapter, connecting the adapter to the chassis, and removing the subassembly from a second opening in the chassis. The adapter remains in the chassis when the subassembly is removed from the second opening and the subassembly and adapter are coupled together when the module is inserted into or removed from the first opening.

Further understanding of the features and advantages of the embodiments described herein may be realized by reference to the remaining portions of the specification and the attached drawings.

EXAMPLE EMBODIMENTS

The following description is presented to enable one of ordinary skill in the art to make and use the embodiments. Descriptions of specific embodiments and applications are provided only as examples, and various modifications will be readily apparent to those skilled in the art. The general principles described herein may be applied to other applications without departing from the scope of the embodiments. Thus, the embodiments are not to be limited to those shown, but are to be accorded the widest scope consistent with the principles and features described herein. For purpose of clarity, details relating to technical material that is known in the technical fields related to the embodiments have not been described in detail.

Network devices such as switches, routers, servers, or other electronic devices may be configured as a modular electronic system with a plurality of removable modules (Field Replaceable Units (FRUs)) (e.g., service cards, line cards, fabric cards, controller cards, optical transceivers, power supply units (PSUs), fan trays, or other cards, components, or modules), which may provide power, cooling, networking, interconnect functions, management capabilities, etc. The modular electronic system may be installed, for example, in an equipment rack or cabinet, with any number of modular electronic systems installed above or below within the rack or cabinet. The rack or cabinet may be located, for example, between a cold aisle where air conditioning provides cold air and a hot aisle with hot air. In an air-cooled modular electronic system, cooling air is supplied to each of the modules to maintain a normal cool state of each module.

It is important that replacement of FRUs is quick and simple to eliminate down time of the modular electronic system. In the design of FRUs, it is important to consider several mechanical attributes such as ease of replacement, tool-less application, and reduction of service and replacement time. External obstacles such as cable management, which potentially constrains access of FRUs, should also be addressed. This is particularly true for modular electronic systems with multiple line cards and numerous optical fibers or Ethernet cables routing away from I/O (Input/Output) ports to a side of the system. Such cable bundles may cause an obstacle for hot swappable components. For example, Ethernet cable bundles attached to line cards may block access to a fan tray. Another aspect of serviceability is measured by the flexibility to install and replace an FRU for a given clearance within the rack or cabinet depth. The goal is to allow installation of the system in various cabinets with minimal space and clearance constraints. This is particularly crucial in shallow cabinet layouts.

Conventional FRUs such as fan trays and other modules have typically been designed in a single serviceable direction to provide either front access or rear access. This is particularly troublesome when there are cable bundles that route to the side of the system, which block access clearance during fan tray replacement. Another drawback is the clearance of the cabinet, such as in the shallow cabinet scenario in which a user may want to have options to service the fan tray either from the front or rear of the system depending on the hardware and infrastructure layout. Single direction access thus prevents coverage for all customer layout needs.

The embodiments described herein provide flexible access to a fan tray or other module, regardless of the layout and access constraint due to cable blockage, for example. The module is configured for dual serviceability, which provides bidirectional installation (insertion/removal) of the module at two different openings. The module may be inserted into or removed from different openings in the modular electronic system, depending on which opening provides the easiest and obstruction free access. One or more embodiments may provide, for example, both front and rear access, such that the module may be installed and removed from the front of the chassis, installed and removed from the rear, installed from the front and removed from the rear, or installed from the rear and removed the front of the chassis. One or more embodiments provide for module insertion and removal (e.g., hot swappable replacement) that is tool-less, simple, and agile. As described below, the module may comprise a fan tray, which may include any number of fan tray subassemblies, each comprising one or more fans, depending on the size of the system and redundancy of cooling requirements within the modular electronic system.

Figure 2:
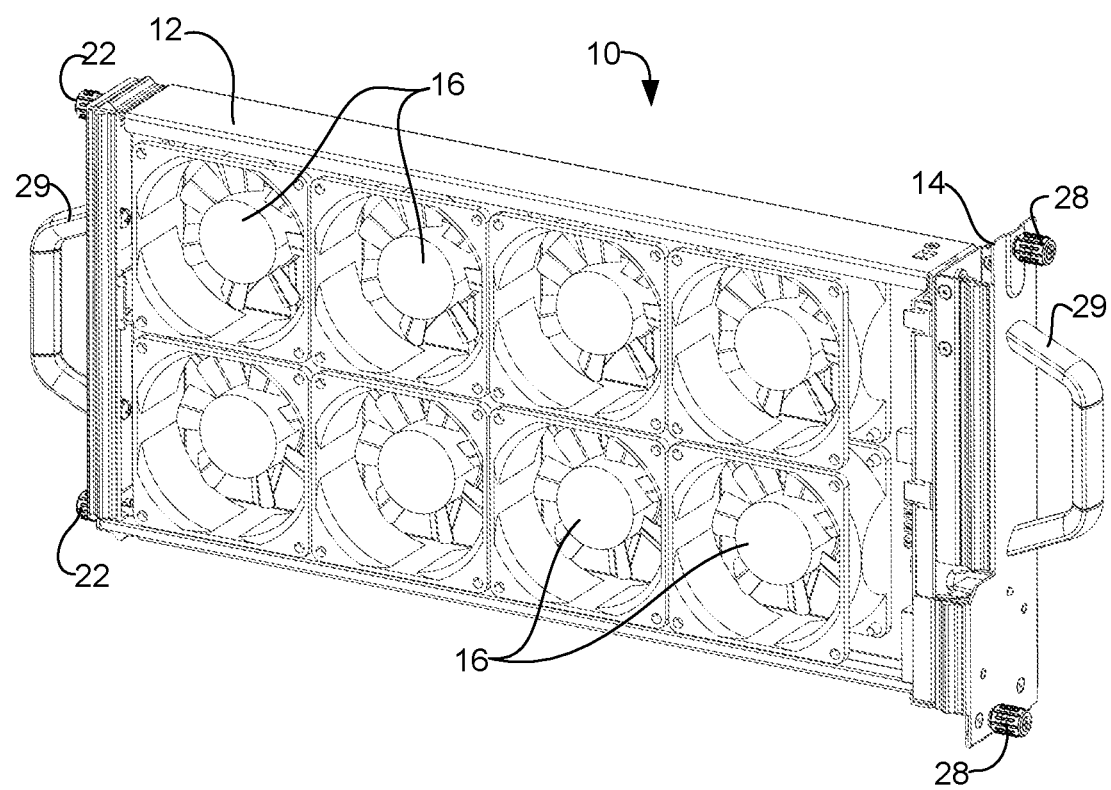
FIG. 2 is a perspective of the bidirectional installation fan tray of FIG. 1 with the adapter connected to the fan tray subassembly.

Referring now to the drawings and first to FIGS. 1 and 2, a bidirectional installation fan tray, generally indicated at 10, is shown in accordance with one embodiment. The fan tray 10 comprises a fan tray subassembly (also referred to herein as a subassembly) 12 and a rear adapter (also referred to herein as an adapter) 14 shown separated in FIG. 1 and coupled together to form the fan tray 10 in FIG. 2. The fan tray subassembly 12 comprises one or more fans 16 along with other fan components (e.g., controller, indicator, sensor (e.g., temperature sensor, fan speed sensor)). The adapter 14 is a passive interconnect that mates the subassembly 12 with a system backplane in the modular electronic system. In the example shown in FIG. 1, the adapter 14 comprises a connector with a first interface 18 for mating with the fan tray subassembly 12 and a second interface 20 for mating with the modular electronic system (e.g., backplane).

In one or more embodiments, the subassembly 12 may be fastened to the adapter 14 and the fan tray 10 may be fastened to the chassis using only thumb screws 22, 28, respectively. As described in detail below with respect to FIG. 7, the thumb screws 22 located on a front face of the subassembly 12 extend to a rear of the subassembly to connect the subassembly to the adapter 14 at openings 26 on the adapter. The thumb screws 28 are used to lock the adapter 14 (or fan tray 10) in place in the chassis, as described below with respect to FIG. 4. The subassembly 12 and adapter 14 each include a handle 29 for insertion or removal of the subassembly or fan tray 10 at the front or rear of the chassis.

As described below with respect to FIG. 3, the subassembly 12 may be inserted into a front opening in the chassis and connected to the adapter 14, which is already installed in the chassis. When the subassembly 12 is pulled from the front opening, the rear adapter 14 stays connected to the system backplane in the chassis. As described below with respect to FIG. 4, the fan tray (module) 10 comprising the coupled subassembly 12 and adapter 14, may be inserted into a rear opening in the chassis. When the fan tray 10 is removed from the rear opening, the entire fan tray (subassembly 12 and adapter 14) is removed.

It is to be understood that the terms front and rear as used herein are relative terms dependent upon orientation or placement of the chassis and should not be interpreted in a limiting manner. These terms describe points of reference and do not limit the embodiments to any particular orientation or configuration. Thus, the terms front and rear as used herein may be interchanged. In one or more embodiments, the openings are positioned to allow for removal of the subassembly or module in generally opposite directions from one another and may be referred to, for example, as first and second openings or rear and front openings. In one or more embodiments, the front of the chassis may refer to a portion of the chassis in which one or more other modules are accessed (e.g., line card, fabric card, power supply unit). The term bidirectional installation as used herein refers to the ability to install (insert/remove) components in two different directions.

The bidirectional installation fan tray may be used in any modular electronic system, including for example, front-to-back or side-to-side air cooling systems and may be replaced without disturbing normal operation of the system (i.e., hot swappable). The fans may be used to cool any components within the modular electronic system (e.g., line cards, fabric cards, optical transceivers). The fan tray may also include more than one subassembly for mating with the adapter. Each subassembly may be independently connected to or disconnected from the adapter and therefore independently inserted into or removed from the chassis.

It is to be understood that the fan tray described herein is only an example and other types of modules or FRUs may be configured with a mating subassembly and adapter as described herein for bidirectional installation (dual serviceability) in the modular electronic system.

Figure 3:
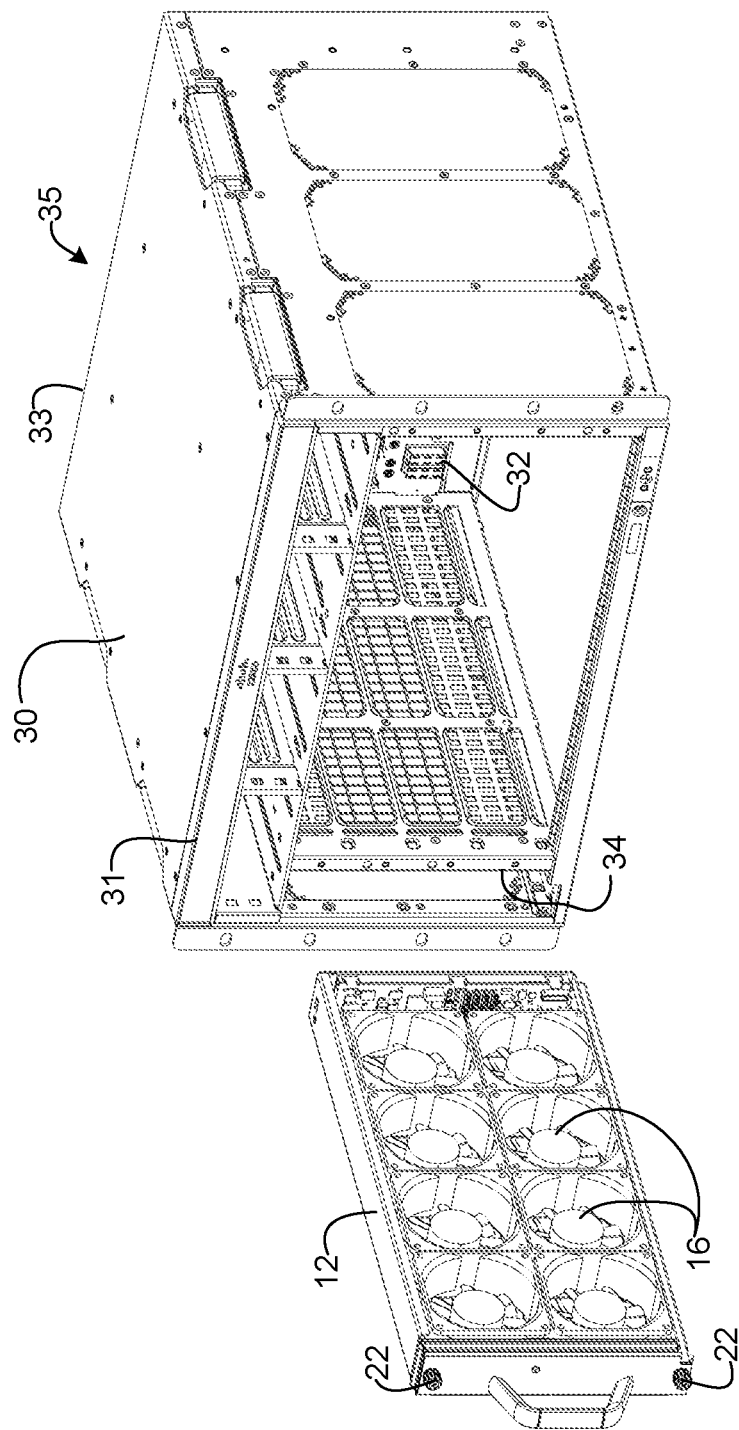
FIG. 3 illustrates installation of the fan tray subassembly of FIG. 1 at a front opening in a chassis.

FIG. 3 illustrates front access of the fan tray subassembly 12 at a chassis 30, in accordance with one embodiment. In this example, one end 31 of the chassis 30 is referred to as the front of the chassis and the opposite end 33 is referred to as the rear of the chassis. As noted above, these terms are used for ease of description and should not be interpreted as limiting the orientation or configuration of the chassis and modules. FIG. 3 illustrates the fan tray subassembly 12 being inserted into or removed from an opening 34 in the front portion 31 of the chassis 30 of a modular electronic system, generally indicated at 35. The modular electronic system 35 comprises the chassis 30 (e.g., frame or other supporting structure) for receiving the fan tray (subassembly 12 and adapter 14 (not shown)) and a plurality of other modules (e.g., line cards, fabric cards, controller cards, power supply units, etc.). In the example shown in FIG. 3, the front portion 31 of the chassis 30 comprises openings for receiving other modules (e.g., cards, power supply, etc.). One or more of the modules may also be installed from the rear of the chassis.

The adapter 14 may already be installed at the rear 33 of the chassis 30 and coupled to a system backplane 32 (FIGS. 1 and 3). The subassembly 12 is inserted into slot 34 and a connector on a rear face of the subassembly is aligned with the interface 18 of the mating connector on the adapter 14 (described below with respect to FIGS. 5A and 5B). As described below with respect to FIG. 6, the connector is configured to provide planar floatation to account for manufacturing tolerances and ensure proper engagement of the subassembly 12 and adapter 14.

After the fan tray subassembly 12 is inserted into the slot 34 (front opening) and mated with the rear adapter 14, the two thumb screws 22 are tightened to securely attach the subassembly 12 to the adapter (and the fan tray 10 to the chassis 30) (FIGS. 1 and 3). In order to remove the fan tray subassembly 12, the two thumb screws 22 are loosened and then the fan tray subassembly is free to be removed from the front opening 34. As previously noted, the rear adapter 14 remains installed inside the system chassis 30. The rear adapter 14 may also be installed after installation of the fan tray subassembly 12, as described below with respect to FIG. 8.

Figure 4:
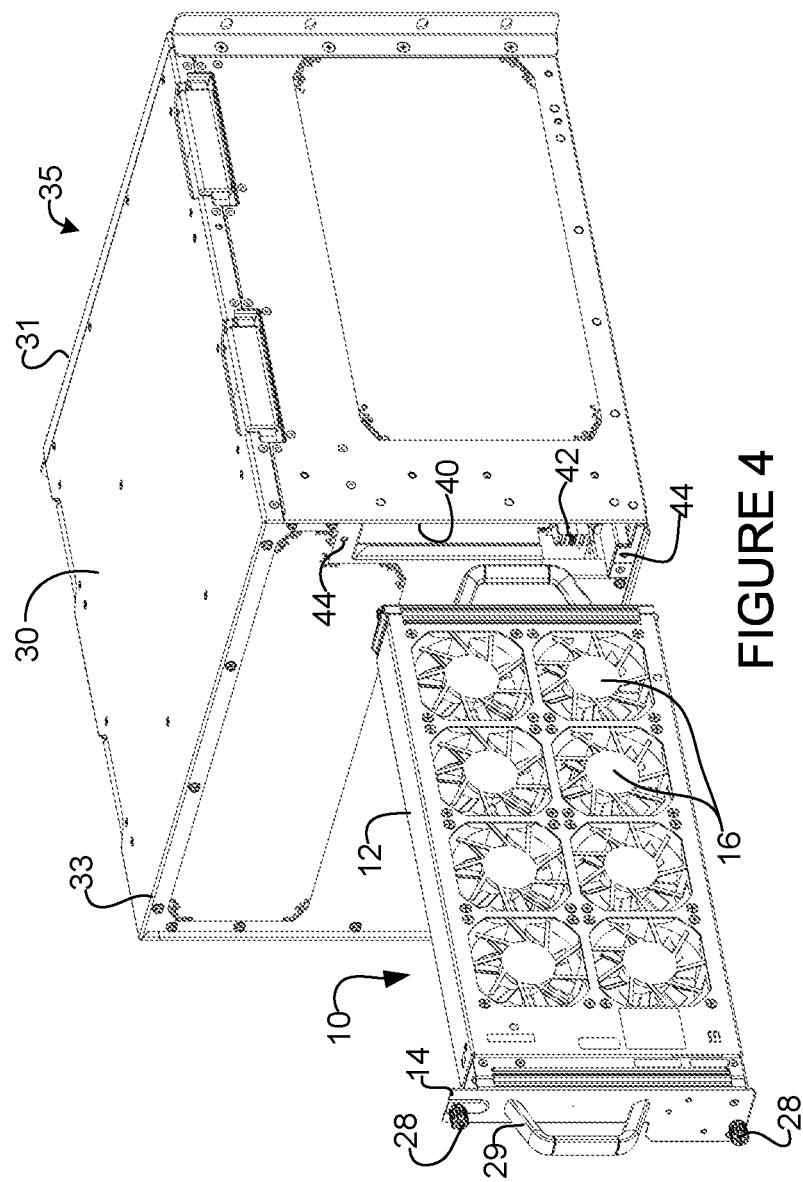
FIG. 4 illustrates installation of the fan tray of FIG. 2 at a rear opening in the chassis.

FIG. 4 illustrates installation of the fan tray (module) 10 at the rear 33 of the chassis 30. As previously described, the entire fan tray 10 (coupled fan tray subassembly 12 and adapter 14) are inserted as one unit into slot 40 (rear opening) in the chassis 30. The interface 20 on the adapter 14 mates with a backplane connector 42 in the chassis (FIGS. 1 and 4). The thumb screws 28 connect to the chassis 30 at openings 44 in the chassis. After the fan tray 10 is inserted into the slot 40 and the adapter interface 20 is aligned and coupled with the backplane connector 42, the thumb screws 28 on the adapter are tightened to secure the fan tray 10 to the chassis 30. In order to remove the fan tray 10, the thumb screws 28 are loosened and the entire fan tray 10 (subassembly 12 and adapter 14) is removed from the chassis 30.

It is to be understood that the modular electronic system 35 shown in FIGS. 3 and 4 is only an example and that the system may comprise any number of openings for receiving any number or type of modules (e.g., power supply unit, fan tray, cards) in any arrangement or format and with any shape or size chassis without departing from the scope of the embodiments. The modular electronic system may operate, for example, as a switch, router, server, network convergence system, or any other network device comprising modules (components, cards, trays, elements, units) included in modular sections.

Figure 5A:
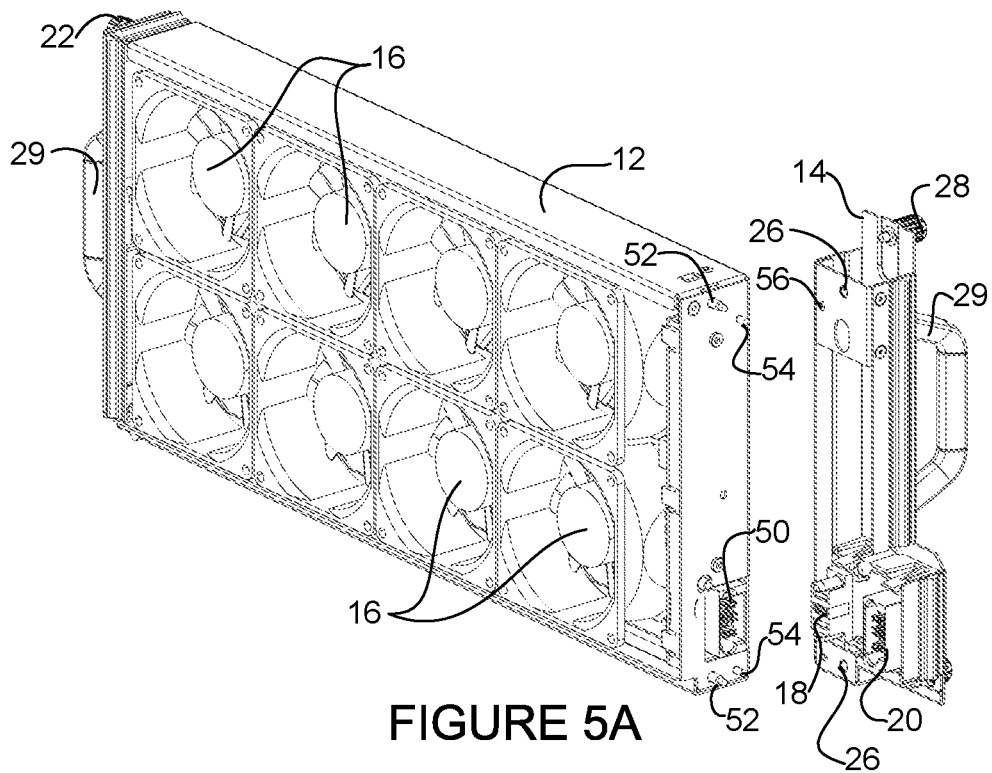
FIG. 5A is a perspective of the fan tray subassembly and the adapter showing mating interfaces.
Figure 5B:
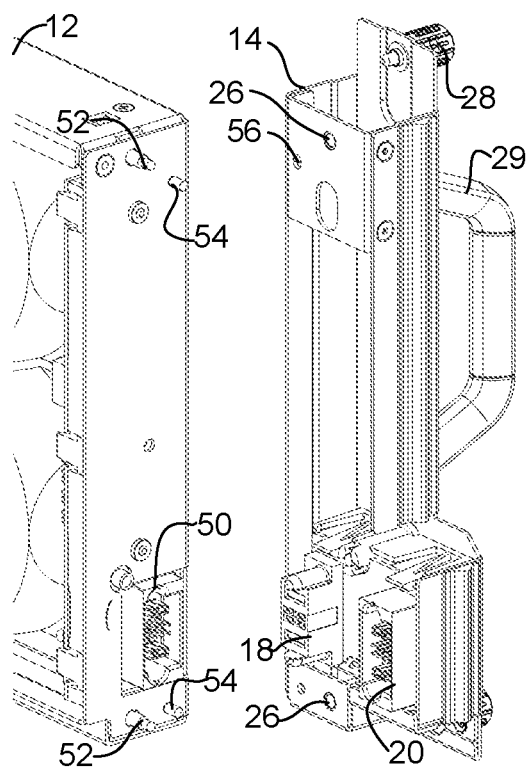
FIG. 5B is an enlarged partial perspective of the fan tray subassembly and adapter shown in FIG. 5A.

FIGS. 5A and 5B illustrate details of mating interfaces on a rear face of subassembly 12 and front face of adapter 14. The adapter 14 comprises the first interface 18 for mating with a corresponding interface 50 on the subassembly 12. As previously described, the adapter 14 further comprises a second interface 20 for connection with the backplane connector 42 of the modular electronic system (FIGS. 4 and 5A). The adapter 14 may provide, for example, power and data connections between the subassembly 12 and modular electronic system. Power may be used to power the fans 16 and data may provide control of the fans or information from sensors within the fan tray assembly 12, for example.

As described below with respect to FIG. 7, the thumb screws 22 of the subassembly 12 extend longitudinally through a frame of the subassembly and out from a rear face of the subassembly as shown at 52. The screws 52 are received in openings 26 on the adapter 14 to couple the subassembly 12 to the adapter. The subassembly 12 may also include one or more alignment pins 54 for insertion into openings 56 on a front face of the adapter 14.

Figure 6:
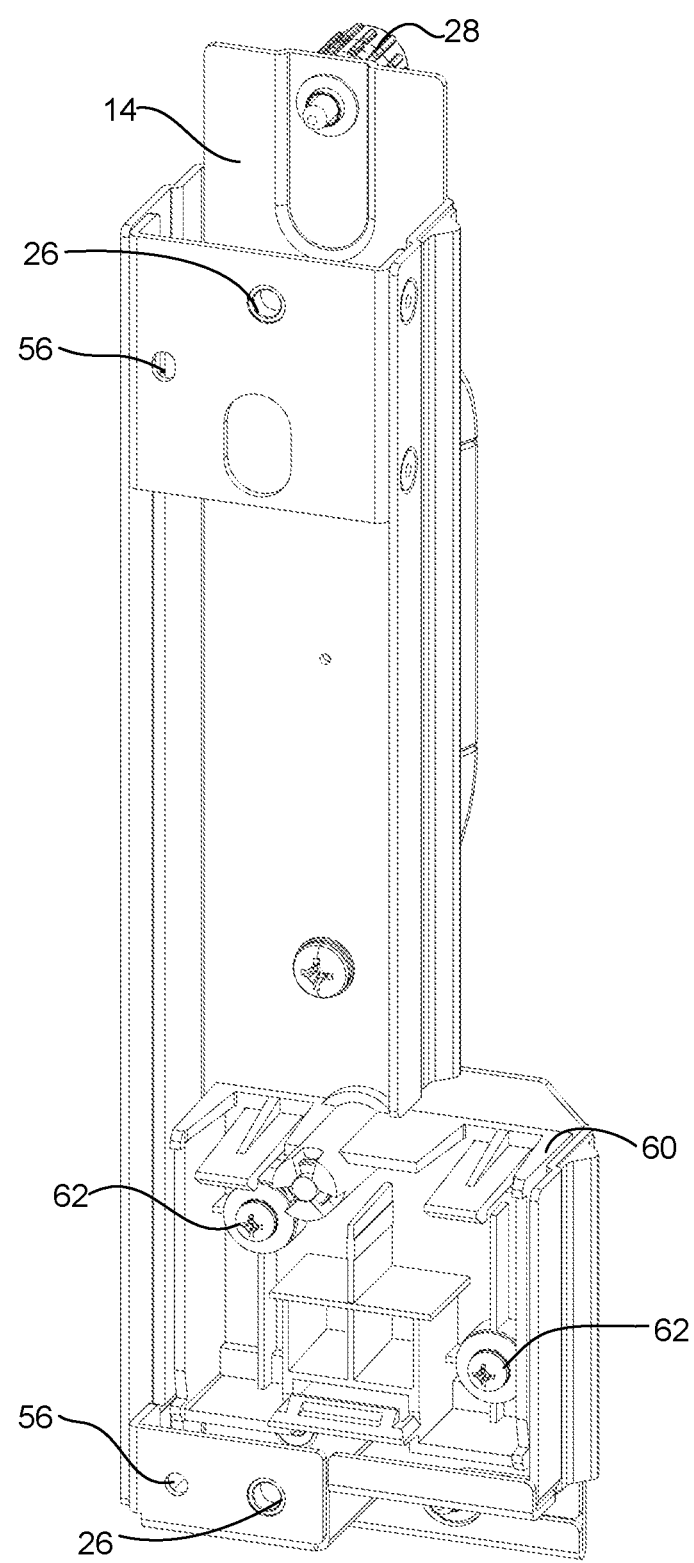
FIG. 6 is a perspective of the adapter with interfaces removed to show a floating connector, in accordance with one embodiment.

FIG. 6 is a front perspective of the adapter 14 with interfaces 18, 20 removed to show detail of an interface mount (connector) 60. In one or more embodiments, the connector 60 is attached to the adapter 14 with a floating screw 62 connection to provide float in both X and Y directions. In order to ensure proper mating of the two portions of the fan tray assembly (subassembly 12 and adapter 14) and the fan tray adapter to the system backplane, the connector 60 preferably provides sufficient planar floatation to account for system tolerances. The mating connector on the subassembly may also include a floating connection. For example, when the adapter 14 is installed in the chassis 30, the connector 60 is fixed due to engagement to the backplane, thus when the front fan tray subassembly 12 engages with the rear adapter, floatation on the subassembly's connector permits wider acceptance tolerance during engagement. Similarly, when the complete fan tray assembly 10 is inserted from the rear of the system, the rear adapter's PCA (Printed Circuit Assembly)/connector needs to provide planer float to absorb any position tolerance from the fixed system backplane.

Figure 7:
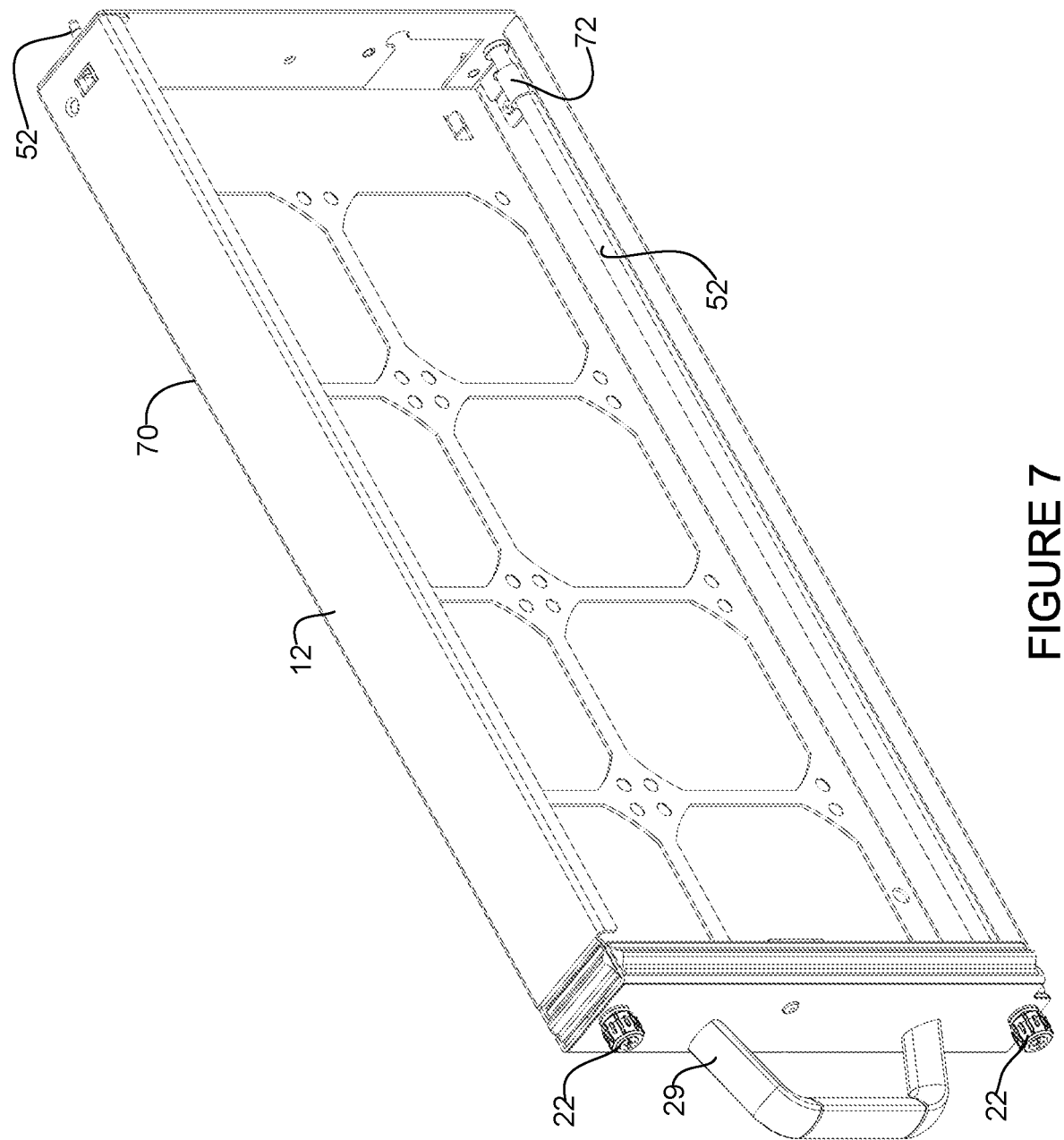
FIG. 7 is a perspective of the fan tray subassembly with fans removed.

FIG. 7 shows a frame 70 of the fan tray subassembly 12 with the fans 16 removed (FIGS. 1 and 7). As previously noted, the thumb screws 22 extend rearward longitudinally (as shown at 52) and extend from the frame to attach to the adapter. One or more brackets 72 may be used to retain the screw in place within the frame 70.

Figure 8:
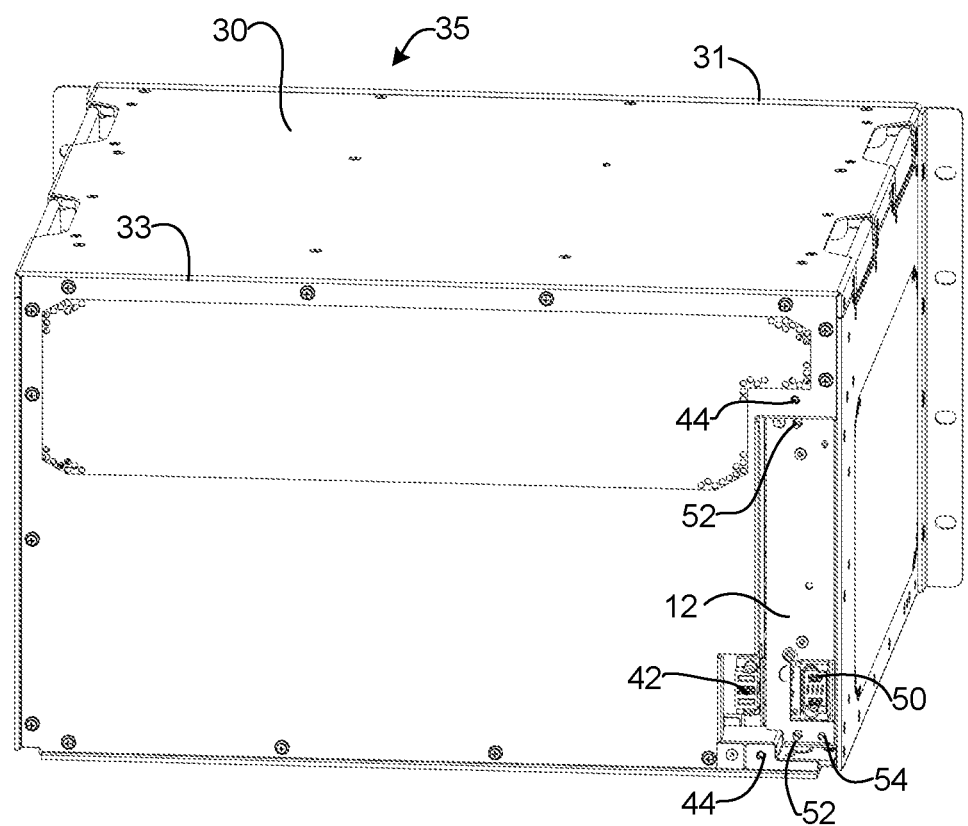
FIG. 8 is a rear perspective of the chassis with the fan tray subassembly installed and the adapter removed.

FIG. 8 is a rear perspective of the chassis 30 with the subassembly 12 inserted (through the front opening) and the adapter removed. As previously described, the subassembly 12 includes connector 50 for mating with the adapter. The system backplane connector 42 is located adjacent to the subassembly 12 when installed in the chassis 30, for matting with the second interface 20 of the adapter 14 (FIGS. 5B and 8). A rear panel of the chassis 30 includes openings 44 for receiving the thumb screws 28 on the rear adapter.

It is to be understood that the modular electronic system and module shown in FIGS. 1-8 and described above is only an example and different bidirectional installation modules may be used in different modular electronic systems, without departing from the scope of the embodiments. For example, as previously noted the module may comprise a fan tray or other modular component. The module may be inserted in any orientation (e.g., horizontal or vertical) in any location within the chassis (e.g., left, right, top, bottom, center, or any other location within the chassis). Also, the front and rear openings in the chassis shown and described herein are only examples and the openings may be located on any two sides of the chassis.

Figure 9:
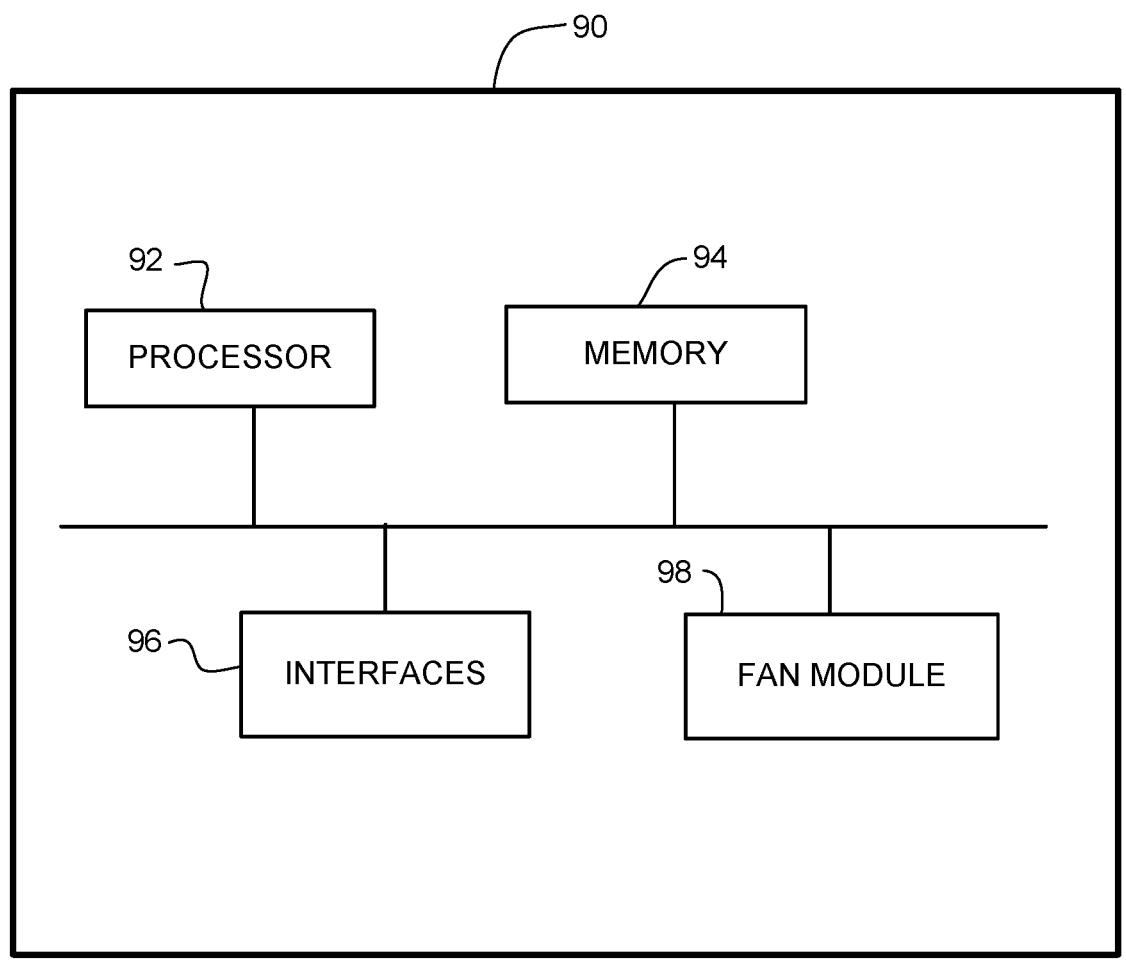
FIG. 9 illustrates a network device in which the embodiments described herein may be implemented.

FIG. 9 illustrates an example of a network device 90 (e.g., modular electronic system) that may be used to implement the embodiments described herein. In one embodiment, the network device 90 is a programmable machine that may be implemented in hardware, software, or any combination thereof. The network device 90 includes one or more processor 92, memory 94, network interfaces 96, and fan module (e.g., fan controller or other fan components) 98.

Memory 94 may be a volatile memory or non-volatile storage, which stores various applications, operating systems, modules, and data for execution and use by the processor 92. For example, components of a fan controller (e.g., code, logic, software, firmware, etc.) may be stored in the memory 94. The network device 90 may include any number of memory components.

Logic may be encoded in one or more tangible media for execution by the processor 92. For example, the processor 92 may execute codes stored in a computer-readable medium such as memory 94. The computer-readable medium may be, for example, electronic (e.g., RAM (random access memory), ROM (read-only memory), EPROM (erasable programmable read-only memory)), magnetic, optical (e.g., CD, DVD), electromagnetic, semiconductor technology, or any other suitable medium. In one example, the computer-readable medium comprises a non-transitory computer-readable medium. The network device 90 may include any number of processors 92.

The fan module 98 may comprise one or more components operable to monitor and control fans through input received from the fans or temperature sensors and fan control input provided through data connections, for example.

The network interfaces 96 may comprise any number of interfaces (connectors, line cards, ports) for receiving data or transmitting data to other devices. The network interface 96 may include, for example, an Ethernet interface or an optical transceiver for connection to a computer or network.

In one or more embodiments, the network device 90 operates in a data communications network including multiple network devices that may communicate over one or more networks (e.g., local area network (LAN), metropolitan area network (MAN), wide area network (WAN), virtual private network (VPN) (e.g., Ethernet virtual private network (EVPN), layer 2 virtual private network (L2VPN)), virtual local area network (VLAN), wireless network, enterprise network, corporate network, data center, Internet, intranet, radio access network, public switched network, or any other network).

It is to be understood that the network device 90 shown in FIG. 9 and described above is only an example and that different configurations of network devices may be used. For example, the network device 90 may further include any suitable combination of hardware, software, algorithms, processors, devices, components, or elements operable to facilitate the capabilities described herein.

Figure 10:
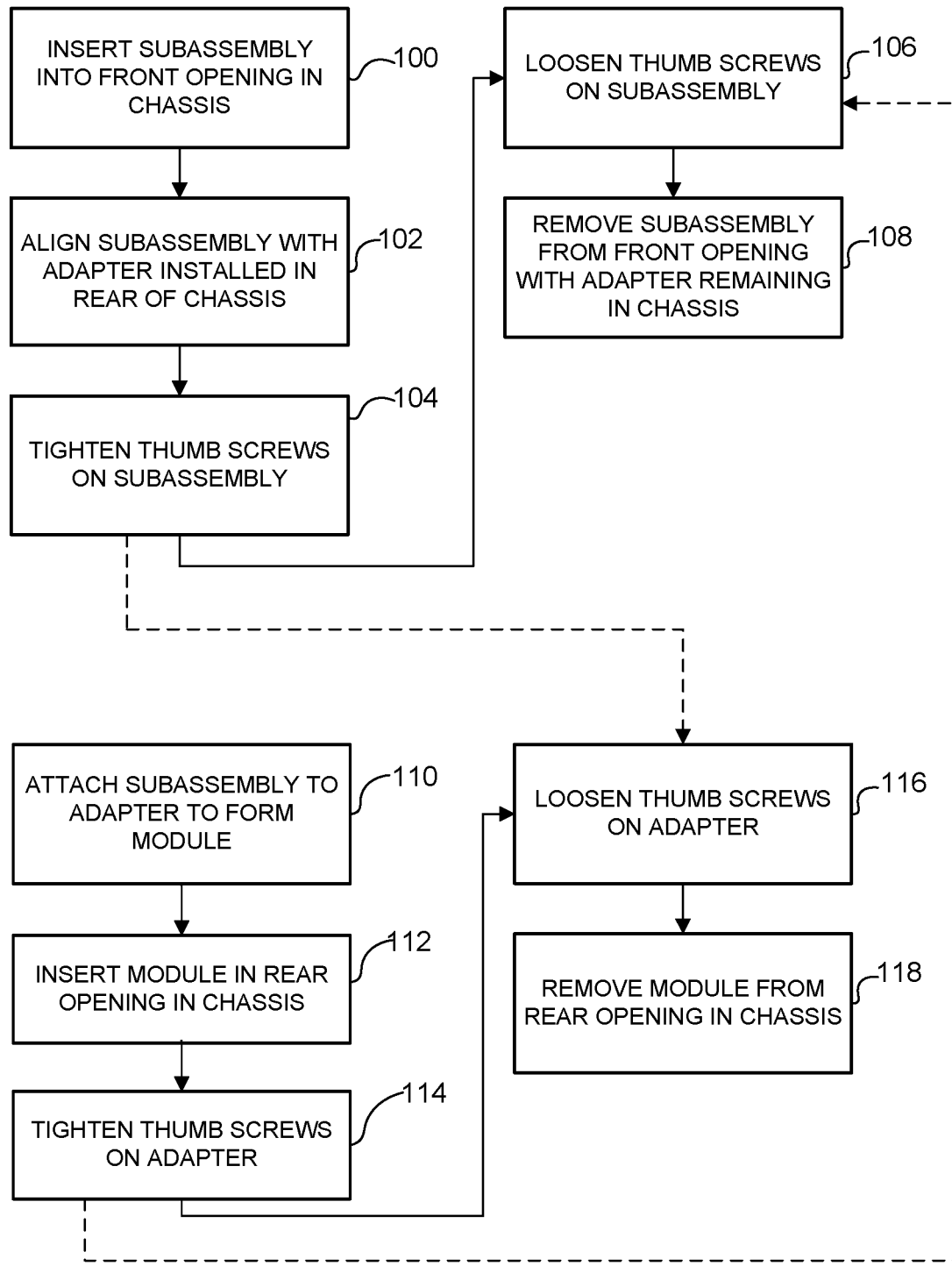
FIG. 10 is a flowchart illustrating an overview of a process for inserting and removing the fan tray subassembly and fan tray, in accordance with one embodiment.

FIG. 10 is a flowchart illustrating a process for installation of the subassembly 12 and module 10. Steps 100-108 describe insertion and removal of the subassembly 12 at the front opening 34 (FIGS. 3 and 10). Steps 110-118 describe insertion and removal of the module 10 at the rear opening 40 of the chassis 30 (FIGS. 4 and 10). As indicated by dashed lines in FIG. 10, the subassembly 12 may be inserted into the front opening 34 and the module 10 removed from the rear opening 40 or the module may be inserted into the rear opening 40 and the subassembly 12 removed from the front opening 34. Dual serviceability of the module provides ease of access and flexibility as to which opening is used to insert or remove components based on, for example, which opening is accessible after cables are installed or the modular electronic system is installed in a rack or cabinet.

In the example shown in steps 100-108, the adapter 14 is positioned within the chassis 30 and connected to the backplane. At step 100, the subassembly 12 is inserted into the front opening 34 in the chassis 30 (FIGS. 3 and 10). The subassembly 12 is aligned with the adapter 14 installed in the rear of the chassis 30 (step 102). The thumb screws 22 on the subassembly 12 may then be tightened (e.g., finger tightened) to secure the subassembly in place (step 104). In order to remove the subassembly 12 from the front opening 34 in the chassis 30, the thumb screws 22 on the subassembly 12 are loosened (e.g., finger loosened) (step 106) and the subassembly is slid out from the front opening 34 in the chassis 30 (step 108). As previously noted, the module 10 may instead be removed from the rear opening 40 of the chassis 30 (steps 116-118).

At step 110, the subassembly 12 is coupled to the adapter 14 to form the module 10. As described above with respect to FIGS. 5A and 5B, the connector 50 on the subassembly 12 is mated with the connector 18 on the adapter 14 and the thumb screws 22 on the subassembly are tightened to couple the subassembly and adapter 14. The module 10 is then inserted into the rear opening 40 in the chassis 30 (step 112). The thumb screws 28 on the adapter 14 are tightened to connect the adapter to the chassis 30 and secure the module within the modular electronic system (step 114). In order to remove the module 10 from the rear opening 40, the thumb screws 28 on the adapter 14 are loosened (step 116). The module 10 is then slid out from rear opening 40 in the chassis 30 (step 118). As previously noted, the subassembly 12 may instead be removed from the front opening 34 (steps 106-108).

It is to be understood that the process described above and shown in FIG. 10 is only an example and steps may be modified, added, reordered, or removed, without departing from the scope of the embodiments. For example, only one opening may be used to insert and remove the subassembly 12 or module 10 or both openings may be used. Also, as previously noted, the terms front and rear are relative terms depending on the orientation of the chassis and may be interchanged. In the example shown in steps 100-108, the adapter 14 is already inserted into the chassis and coupled to the backplane of the modular electronic system. In another example, the subassembly 12 may be inserted first and positioned within the chassis 30 and the adapter 14 then inserted into the rear of the chassis and connected to the subassembly and backplane.

As can be observed from the foregoing, one or more embodiments provide many advantages. For example, the bidirectional installation (dual serviceability) module (e.g., fan tray) solves access challenges due to cable obstruction or limited cabinet clearance. The dual serviceable design eliminates cable routing blockage and clearance/access concerns in modular electronic systems. The bidirectional installation module is easy to maneuver, agile, and may require no tools to install or remove. In one or more embodiments, the two part assembly addresses the challenge of blind mating via a floating mechanism to achieve better planar position tolerances. The design is cost effective with only the addition of a rear adapter comprising a metal component, two power connectors, and a small printed circuit assembly, while solving multiple challenges and providing service and rack layout options, thereby adding increased value. The embodiments are scalable with respect to system size and cooling redundancy needs and may be divided into several independent assemblies if needed.

Although the method and apparatus have been described in accordance with the embodiments shown, one of ordinary skill in the art will readily recognize that there could be variations made to the embodiments without departing from the scope of the embodiments. Accordingly, it is intended that all matter contained in the above description and shown in the accompanying drawings shall be interpreted as illustrative and not in a limiting sense.

What is claimed is:

1. An apparatus comprising:
   a module for installation in a modular electronic system, the module comprising:
   a subassembly for insertion into a front opening in a chassis of the modular electronic system or removal from said front opening in the chassis; and
   an adapter comprising a first interface for mating with the subassembly and a second interface for mating with the modular electronic system, wherein the adapter remains in the chassis during removal of the subassembly from said front opening in the chassis;
   wherein the module is configured for insertion into a rear opening in the chassis or removal from said rear opening in the chassis with the subassembly coupled to the adapter.

2. The apparatus of claim 1 wherein the module comprises a fan tray and the subassembly comprises a plurality of fans.

3. The apparatus of claim 1 wherein the subassembly is coupled to the adapter with thumb screws.

4. The apparatus of claim 3 wherein the thumb screws extend from a front face of the subassembly to a rear face of the subassembly for attachment to the adapter.

5. The apparatus of claim 1 wherein said first interface and said second interface of the adapter comprise a floating interface for alignment with the subassembly and the modular electronic system.

6. The apparatus of claim 1 wherein said second interface comprises a power and data interface for mating with a system backplane of the modular electronic system.

7. The apparatus of claim 1 wherein a front face of the subassembly and a rear face of the adapter each comprises a handle for insertion and removal of the subassembly or the module.

8. The apparatus of claim 1 wherein the adapter comprises at least one thumb screw for attachment of the adapter to the chassis.

9. A modular electronic system comprising:
   a chassis comprising openings on opposite sides thereof; and
   a fan tray comprising:
   a fan tray subassembly comprising a plurality of fans; and
   an adapter for coupling the fan tray subassembly to the modular electronic system;
   wherein the fan tray subassembly is configured for insertion into and removal from one of said openings in the chassis for mating with the adapter installed in the chassis and the fan tray comprising the coupled fan tray subassembly and the adapter is configured for insertion into and removal from said other opening in the chassis; and
   wherein the adapter remains in the chassis during removal of the fan tray subassembly from said one of said openings.

10. The modular electronic system of claim 9 wherein the fan tray subassembly is coupled to the adapter with at least one thumb screw.

11. The modular electronic system of claim 10 wherein the thumb screw extends from a front face of the fan tray subassembly to a rear face of the fan tray subassembly for attachment to the adapter.

12. The modular electronic system of claim 9 wherein the adapter comprises a first interface for mating with the fan tray subassembly and a second interface for mating with a backplane of the modular electronic system.

13. The modular electronic system of claim 12 wherein said first interface and said second interface of the adapter comprise a floating interface for alignment with the fan tray subassembly and a backplane connector.

14. The modular electronic system of claim 9 wherein the fan tray subassembly and the adapter each comprise handles for insertion and removal of the fan tray subassembly or the fan tray.

15. The modular electronic system of claim 9 wherein the adapter comprises at least one thumb screw for attachment to the chassis.

16. A method comprising:
   inserting a module into a first opening in a chassis, the module comprising a subassembly and an adapter;
   connecting the adapter to the chassis; and
   removing the subassembly from a second opening in the chassis;
   wherein the adapter remains in the chassis when the subassembly is removed from said second opening and wherein the subassembly and the adapter are coupled together when the module is inserted into or removed from said first opening.

17. The method of claim 16 wherein the module comprises a fan tray.

18. The method of claim 16 further comprising removing the module from said first opening or inserting the subassembly into said second opening.

19. The method of claim 16 wherein inserting the module comprises aligning a floating connector on the adapter with a backplane connector on the chassis.

20. The method of claim 16 wherein removing the subassembly comprises loosening a thumbscrew on the subassembly to disconnect the subassembly from the adapter.

* * * * *